(12) United States Patent
Johnson

(10) Patent No.: US 6,248,650 B1
(45) Date of Patent: Jun. 19, 2001

(54) SELF-ALIGNED BJT EMITTER CONTACT

(75) Inventor: F. Scott Johnson, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/215,765

(22) Filed: Dec. 18, 1998

Related U.S. Application Data

(60) Provisional application No. 60/068,547, filed on Dec. 23, 1997.

(51) Int. Cl.[7] .................................................. H01L 21/38
(52) U.S. Cl. ........................ 438/552; 438/365; 438/563; 438/564; 438/368
(58) Field of Search .................................... 438/203, 204, 438/205, 234, 236, 309, 365, 368, 558, 563, 564, 552, 369; 257/700, 781

(56) References Cited

U.S. PATENT DOCUMENTS 5,480,815 * 1/1996 Watanabe .............................. 438/559
5,648,279 * 7/1997 Imai ...................................... 438/365

* cited by examiner

*Primary Examiner*—Charles Bowers
*Assistant Examiner*—Yennhu B. Huynh
(74) *Attorney, Agent, or Firm*—Jacqueline J. Garner; W. James Brady, III; Frederick J. Telecky, Jr.

(57) ABSTRACT

A bipolar transistor includes a collector region, an intrinsic base region within the collector region, an extrinsic base region within the collector region. and a base link-up region within the collector region between the intrinsic base region and the extrinsic base region. An emitter region is positioned within the intrinsic base region. A base electrode overlays and is in electrical communication with a portion of the extrinsic base region and the base link-up region, and a doped inter-polysilicon dielectric layer overlays a portion of the base electrode. A capping layer is positioned above the inter-polysilicon dielectric layer; and an emitter electrode overlays the inter-polysilicon dielectric layer and the emitter region. The doped inter-polysilicon dielectric layer is the dopant source for forming the extrinsic base region and the base link-up region.

9 Claims, 4 Drawing Sheets

SELF-ALIGNED BJT EMITTER CONTACT

This application claims priority under 35 USC § 119 (e) (1) of provisional application No. 60/068,547 filed Dec. 23, 1997.

FIELD OF THE INVENTION

This invention relates to improvements in semiconductor processing techniques, and more particularly to improved semiconductor structures and associated methods for making semiconductor structures, or the like, and still more particularly to improvements in a semiconductor structure, and associated method of making, of a semiconductor structure not requiring certain mask and implant steps.

BACKGROUND OF THE INVENTION

In the fabrication of self-aligned, double polysilicon (sometimes referred to herein as "poly") bipolar junction transistor (hereinafter "BJT") structures, the polysilicon from which the base-conductor is formed is typically doped with boron by ion implantation. The connection between the extrinsic base and the intrinsic base region is formed by a lateral diffusion of this boron from the base conductor into the underlying silicon. The conductor for contact to the extrinsic base is formed by the base polysilicon. In order to achieve a very low resistance base connection and contact, the polysilicon must be very heavily doped. Boron doses on the order of $5 \times 10^{15}$ cm$^2$ to $1 \times 10^{16}$ cm$^2$ are typically used.

Since the base polysilicon must be kept relatively thin in order to reduce vertical base contact resistance and to create low emitter contact structure aspect ratios, and since the boron implant must be completely contained within the base polysilicon layer to provide a repeatable link-up diffusion and shallow extrinsic base junction, the energy of the boron implant must be kept relatively low. This means that a relatively costly implant step is required. The implant step is costly due to the low throughput that results from low energy boron implants at the required high dosage concentrations.

In a double poly self aligned bipolar junction transistor (DPSA BJT) in a BiCMOS implementation, a single polysilicon is typically used for both the gate of MOS devices and the base polysilicon in the BJT. As a result, separate patterning and implant steps are used to dope the base polysilicon and the gate poly for these devices. A representative section view of a prior art BJT is shown in FIG. 1.

What is needed is a method for eliminating the need for separate patterning and implant steps in a BiCMOS process in the formation of the base polysilicon of the BJT and the gate of the MOS device.

It is with the foregoing problems in mind that the instant invention was developed.

SUMMARY OF THE INVENTION

The present invention concerns an emitter contact structure for, and associated method for making, a bipolar junction transistor in a BiCMOS device. In accordance with a broad aspect of the invention, it has been discovered that by using a boro-silicate-glass inter-poly-dielectric (BSG IPD) between the base and emitter polysilicon in a bipolar or BiCMOS fabrication, the costly extrinsic base mask and implant can be avoided.

The instant invention encompasses a bipolar transistor including a collector region, an intrinsic base region within the collector region, an extrinsic base region within the collector region, and a base link-up region within the collector region between the intrinsic base region and the extrinsic base region. An emitter region is positioned within the intrinsic base region. A base electrode overlays and is in electrical communication with a portion of the extrinsic base region and the base link-up region, and a doped inter-polysilicon dielectric layer overlays a portion of the base electrode. A capping layer is positioned above the inter-polysilicon dielectric layer, and an emitter electrode overlays the inter-polysilicon dielectric layer and the emitter region.

The doped inter-polysilicon dielectric layer can be BSG or PSG, depending on the application, and for instance preferably 5% Boron or PSG by weight. The doped inter-polysilicon dielectric layer overlaps at least a portion or the extrinsic base and the inner end of the base electrode. The doped inter-polysilicon dielectric layer supplies dopant to form the extrinsic base region and the base link-up region.

The instant invention also encompasses a method for constructing a bipolar transistor in a bipolar process, which includes the acts of providing a semiconductor substrate having a collector region, forming a gate electrode layer on the collector region, and forming an inter-polysilicon dielectric layer, having a first dopant, on the polysilicon layer. A capping layer is formed on the inter-polysilicon dielectric layer, and a window is formed through the capping layer, inter-polysilicon dielectric layer, and base electrode layer to a top surface of the substrate. The intrinsic base region is formed in the collector region, and an emitter electrode layer is formed, having a second dopant, on the capping layer and extends into the window to contact the intrinsic base region. The first dopant is diffused from the inter-polysilicon dielectric layer into the collector region, through the base electrode, to form an extrinsic base region and a base link-up region. The second dopant is diffused from the emitter polysilicon layer into the intrinsic base region to form an emitter region therein. The emitter electrode is then patterned with photoresist to selectively cover the emitter electrode over the window, and the emitter electrode layer, the capping layer, and the inter-polysilicon layer are etched to remove the layers from the base electrode where not covered with photoresist.

The acts of forming the first dopant and forming the second dopant can be combined in a rapid thermal anneal step.

Further, the instant invention encompasses a method for constructing a bipolar transistor in a BiCMOS process, including the acts of providing a semiconductor substrate having a collector region, forming a gate electrode layer on the collector region, forming an inter-polysilicon dielectric layer, having a first dopant, on the polysilicon layer, and forming a capping layer on the inter-polysilicon dielectric layer. A window is formed through the capping layer, inter-polysilicon dielectric layer, and base electrode layers to open on a top surface of the substrate. The intrinsic base region is formed in the collector region. An emitter electrode layer, having a second dopant, is formed on the capping layer and extends into the window to contact the intrinsic base region. The emitter electrode is patterned with photoresist to selectively cover the emitter electrode over the window. Then the emitter electrode layer, the capping layer, and the inter-polysilicon layer, are etched where not covered with photoresist to remove the layers from the base electrode. The first dopant from the inter-polysilicon dielectric layer is diffused into and through the base electrode, to dope the base electrode with the first dopant, and to form an extrinsic base region and a base link-up region in the collector region. The second dopant is then diffused from the emitter polysilicon layer into the intrinsic base region to form an emitter region therein A silicide layer can then be formed on the base electrode to improve the resistivity characteristics of the base electrode, if desired.

The instant invention further encompasses a method for constructing a bipolar transistor in a BICMOS process, comprising the acts providing a semiconductor substrate having a collector region, forming a gate electrode layer on the collector region, forming an inter-polysilicon dielectric layer, having a first dopant, on the polysilicon layer, and forming a capping layer on the inter-polysilicon dielectric layer. A window is formed through the capping layer, inter-polysilicon dielectric layer, and base electrode layer to open on a top surface of the collector region in the substrate. The intrinsic base region is formed in the collector region, and an emitter electrode layer, having a second dopant, is formed on the capping layer and extends into the window to contact the intrinsic base region. The emitter electrode is then patterned with photoresist to selectively cover the emitter electrode over the window. The emitter electrode layer, the capping layer, and the inter-polysilicon layer are then etched where not covered with photoresist to remove the layers from the base electrode. The first dopant is then diffused from the inter-polysilicon dielectric layer into and through the base electrode to dope the base electrode with the first dopant, and to form an extrinsic base region and a base link-up region in the collector region. The second dopant is diffused from the emitter polysilicon layer into the intrinsic base region to form an emitter region therein. The emitter polysilicon is then patterned with a P+ source/drain implant pattern to cover the emitter electrode over the window with photoresist. A source/drain implant is then performed to implant a third dopant into the emitter electrode not covered with photoresist.

In addition, the instant invention encompasses a method, and resulting structure for constructing a bipolar transistor in a BiCMOS process, including the acts of providing a semiconductor substrate having a collector region, forming a gate electrode layer on the collector region, and forming an inter-polysilicon dielectric layer on the base electrode. An emitter window is formed through the inter-polysilicon dielectric layer and base electrode layer, the window opening to a top surface of the substrate including the collector region. The intrinsic base region is then formed in the collector region, and an emitter electrode layer, having a first dopant, is formed on the capping layer and extends into the window to contact the intrinsic base region. The emitter electrode is then patterned with photoresist to selectively cover the emitter electrode over the window. The emitter electrode layer and the inter-polysilicon layer, where not covered with photoresist, are etched to remove the layers from the base electrode. The emitter polysilicon is then patterned with a P+ source/drain implant pattern to cover the emitter electrode over the window with photoresist. A source/drain implant is then performed to implant a second dopant into the emitter electrode not covered with photoresist, the second dopant also diffusing to the collector region to form an extrinsic base region and a base link-up region.

In each of the embodiments of the invention set forth above, the process does not require the separate masking step and implant step for implanting the extrinsic base electrode layer.

In light of the above, therefore, it is a primary object of the invention to provide an improved method of fabricating semiconductor devices.

It is another object of the invention to provide a technique in a BiCMOS process in which a masking step for separately implanting the extrinsic base layer can be eliminated, along with the separate extrinsic base implant.

It is another object of the invention to provide a technique in a BiCMOS process in which a single masking and implant step may be used to simultaneously implant the extrinsic base layer, the P+ source/drain, and the P+ PMOS gate polysilicon.

These and other objects, features, and advantages of the invention will become apparent to those skilled in the art from the following detailed description, when read in conjunction with the accompanying drawings and appended claims.

DETAILED DESCRIPTION OF THE PREFERRED EMBODIMENT

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention. The specific processing parameters of the process or method steps described below, unless otherwise specified, are a particular design choice required to meet the needs of a particular application or technology, and to meet the needs of available processing equipment and limitations.

The invention is described herein in conjunction with a double polysilicon bipolar junction transistor (BJT) formed using a BiCMOS process. It will be apparent to those skilled in the art that the invention is also applicable to other BiCMOS processes and devices as well as to bipolar processes and devices.

Figure 1:
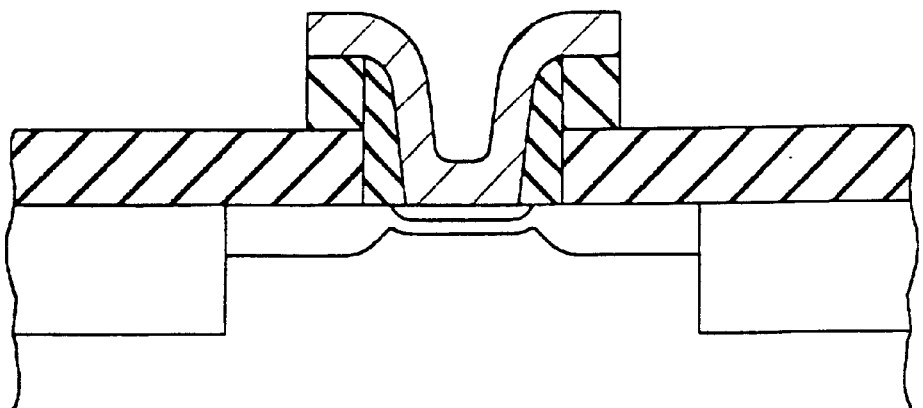
FIG. 1 is a section view of a prior art BJT.
Figure 2:
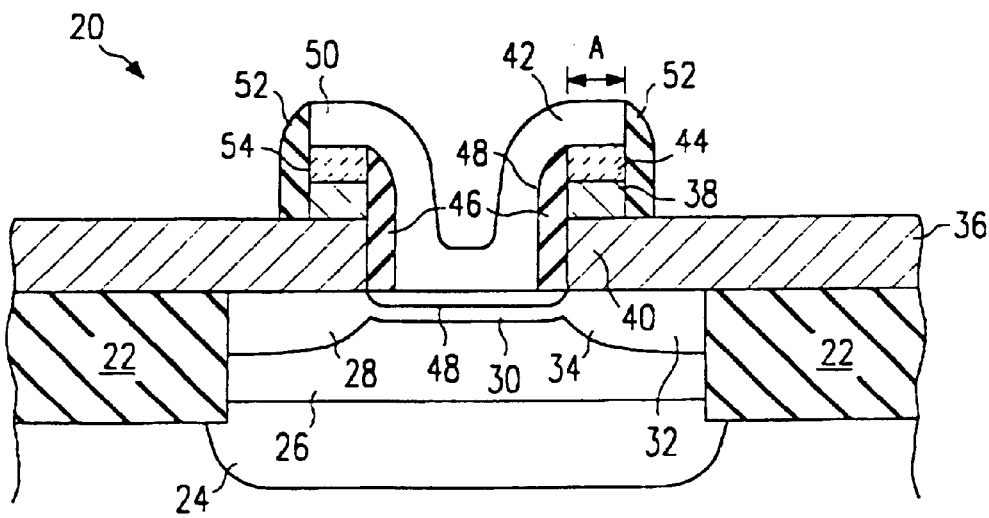
FIG. 2 is a representative section view of a BJT made in accordance of the present invention.

A BJT 20 according to the invention is shown in FIG. 2. Field insulating regions 22 isolate the BJT from other devices (not shown), such as other BJT's, MOS transistors, diodes and resistors, etc. The field isolating regions 22 can be formed by trench isolation, or by standard LOCOS processes, as are known in the art. A buried layer 24 extending between the opposing isolation regions 22 is formed in the collector region of the substrate and acts as a collector, as is well known in the art. A self-aligned collector implant region 26 extends from the buried layer upwardly to contact the base region 28. The buried layer 24 is preferably doped at a level of 5E19 to 1E20 atoms per cubic centimeter of arsenic (As), and the collector implant is preferably doped at a level of 1E17 atoms per cubic centimeter of phosphorous (P).

The base region 28 consists of an intrinsic base region 30, an extrinsic base region 32, and a base link-up region 34. The intrinsic base region 30 forms a junction with the self-aligned collector implant region 26. The extrinsic base region 32 provides an area for connection to the base region by a base electrode 36 for electrical connection to the base contact (not shown). The base link-up region 34 provides a low resistance connection between the extrinsic and intrinsic base regions. The intrinsic 30, extrinsic 32 and base link-up 34 regions all have the same conductivity type. For example, if the collector region is N-type, the base regions are P-type. Alternatively, if the collector region is P-type, the base regions are N-type.

The base electrode 36 comprises a layer of doped polysilicon and is connected to the extrinsic base region 32 by overlaying and contacting the upper surface of the extrinsic base region. The base electrode 36 can be the dopant source for forming the extrinsic base 32 and base link-up 34 regions. If it is the dopant source, then for an NPN BJT the base electrode is doped P-type. Alternatively, for a PNP BJT, the base electrode is doped N-type. Regardless, the base electrode 36 is doped to provide the desired conductivity of the base electrode. The base electrode could be undoped with a silicided surface, or doped with a silicided surface, as is described below.

An inter-polysilicon dielectric layer 38 (IPD) is positioned above the interior end 40 of the base electrode 36, and extends over the base link-up region 34 and/or the extrinsic base region 32. The IPD layer 38 can act as a diffusion source for doping the base polysilicon 36, the base link-up 34 and extrinsic regions 32, and functions as a dielectric between the base electrode 36 and the emitter electrode 42. The IPD can be in-situ doped or implanted with dopant by known or available processes. Preferably, the IPD 38 is BSG (for NPN transistors) with about 5% by weight of Boron. PSG can be used for PNP transistors. The IPD and its role as a doping source is explained in greater detail below. The IPD is capable of being selectively etched with respect to silicon and is compatible with conventional semiconductor processing.

A barrier layer 44 is formed on and is coextensive with the upper surface of the IPD 38. The barrier layer is a capping layer, such as $Si_3N_4$ or TEOS. The barrier layer inhibits up-diffusion of dopants from the IPD 38 into the overlying emitter polysilicon 42.

Base-emitter spacers 46 are positioned in the emitter contact opening and cover the outer edge of the emitter region 48 and the inner edge of the intrinsic base region 30. The combination of the base emitter spacers 46, the capping layer 44 and the IPD 38 electrically isolate the emitter polysilicon layer 42 from the base polysilicon layer 36. The base-emitter spacers 46 can be formed of the same material as the capping or dielectric layer. The emitter polysilicon layer 42 fills the contact opening 48 and forms the emitter electrode 42. The emitter electrode is doped, as is known in the art, and is the dopant source for the emitter region 48. The outer edge 50 of the emitter electrode 42, the capping layer 44, and the IPD 38 are formed coextensively with one another. Thus, the emitter electrode 42, capping layer 44 and IPD 38 overlap the inner end 40 of the base electrode 36 by a dimension "A." The emitter electrode 42 has the opposite conductivity of the base electrode 36.

The stacked structure of the second polysilicon layer 42, the capping layer 44, and the IPD 38 are patterned and together etched to the surface of the first polysilicon (base electrode) layer 36. Outer sidewall spacers 52 are formed on the common outer sidewall 54 of the emitter contact stack. They are formed to improve the topographical transition for subsequent layers, and to isolate the silicide formation on the exposed emitter and base electrode surfaces if silicide is used.

During formation of the emitter contact structure, various processes can be performed to create the appropriate base and emitter regions, as well as treat the base polysilicon to improve its conductivity. Some of these processes work for BJTs in bipolar processes only, and others work for BJT's only in an integrated BiCMOS process. The details of each process are described below.

Figure 3:
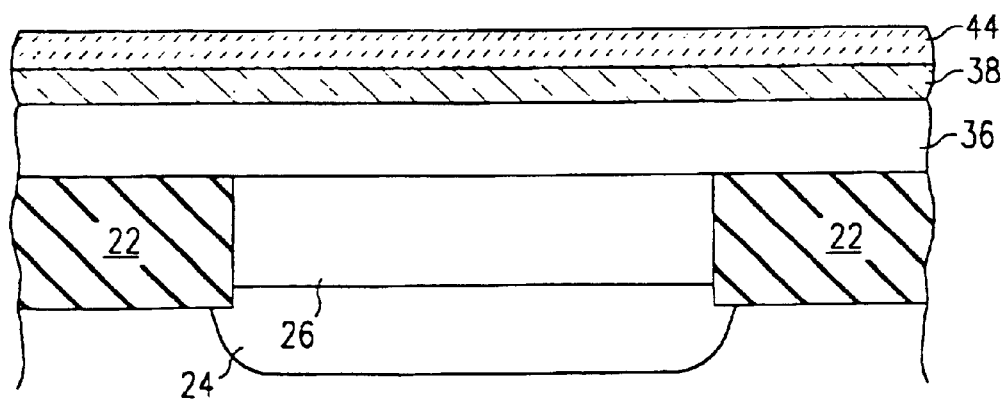
FIG. 3 is a representative section view of the base electrode layer, IPD, and capping layer prior to emitter window formation.

FIG. 2 illustrates the semiconductor BJT structure that has been described. The formation of the BJT 20 according to the invention and as shown in the structure of FIG. 2 will now be described as show in FIGS. 3–10. FIG. 3 shows the formation of the collector region and field insulating regions 22. The collector region may include a buried layer 24, an epitaxial layer, and an N+ collector sink as is well known in the art. A first layer of polysilicon 36 is deposited to a thickness on the order of 2000 to 3000 Å. The first layer of polysilicon is the base electrode.

An IPD diffusion source layer 38 is then deposited on top of the first layer of polysilicon 36. The IPD diffusion source layer is deposited to a thickness of approximately 1000 Å. The IPD diffusion source layer 38 is preferably doped to a level of 5% Boron by weight. The IPD diffusion source layer comprises a material that may be etched selectively with respect to polysilicon, and that may function as a dopant source for the base link up region 34 and the extrinsic base region 32 to be formed later in the process, and/or for an inner portion 40 of the base electrode 36. The IPD diffusion source layer 38 is preferably doped in situ or implant-doped after deposition. The doping concentration of the IPD diffusion source layer 38 is determined by the desired resistance of the base link-up region 34 and extrinsic base region 32 to be subsequently formed. For instance, if the IPD source layer 38 were BSG glass, the dopant level would be approximately 5% Boron by weight.

A capping layer 44 is then deposited on the IPD diffusion source layer 38 as a barrier to up-diffusion of the dopant from the IPD diffusion source layer, and to further form of the dielectric isolation between the base polysilicon layer 36 and the emitter polysilicon layer 42 to be subsequently deposited. The capping layer 44 can be TEOS, silicon nitride, or any other dielectric barrier material, and is approximately 1000 Å thick.

Figure 4:
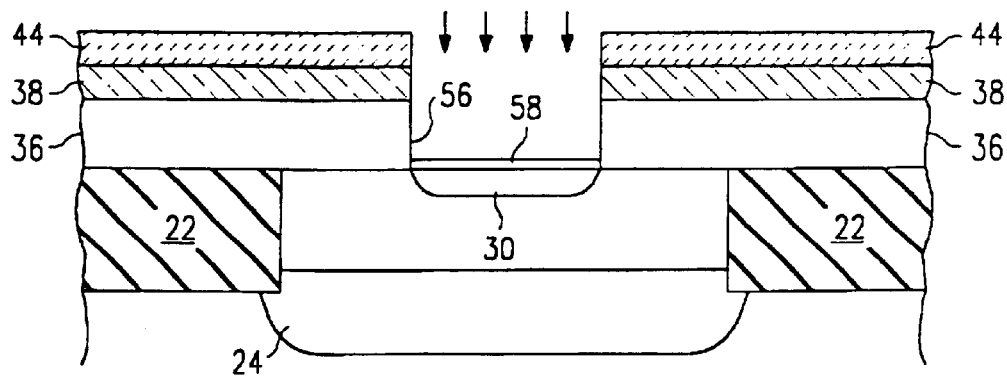
FIG. 4 is a representative section view of the emitter window formation and intrinsic base implant step.

The IPD diffusion source layer 38, the capping layer 44, and the first polysilicon layer 36 are then patterned and etched to form the emitter window 56, as shown in FIG. 4. The etch process is highly selective against polysilicon so as to not damage the polysilicon at the bottom of the emitter window 56 exposed during the etch process.

The intrinsic base region 32 is then implanted through a screen oxide 58 grown on the exposed silicon at the bottom of the emitter window. The screening oxide formation and base emitter implant process are both processes known or available in the art. The capping layer 44 does not require protection from the base ion implant since it is low dose and low energy. The screen oxide 58 is then removed.

Figure 5:
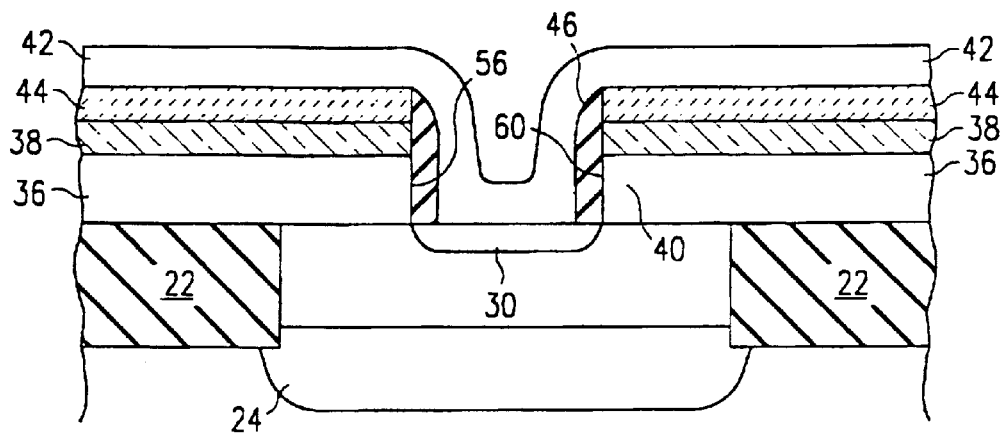
FIG. 5 is a representative section view of the emitter polysilicon after deposition into the emitter window formation.

As shown in FIG. 5, base-emitter spacers 46 are then formed to space the edges of a subsequently formed emitter region 48 from the outer edges of the intrinsic base region 30. The base-emitter spacer 46 provides a controlled and repeatable link-up distance for the base diffusion that is independent from the lithography variations. The base-emitter spacer 46 covers the common sidewall 60 of the exposed base electrode layer 36, the IPD 38, and the capping layer 44 formed during the formation of the emitter window 56. The spacer 46 can be made of silicon nitride ($Si_3N_4$) and can be formed with a conventional known or available deposition and anisotropic etch back process As also shown in FIG. 5, a second layer of doped polysilicon 42 is then deposited on top of the capping layer 44 and into the emitter opening 56. The second layer of polysilicon 42 is the emitter electrode. The second layer of polysilicon 42 has a thickness on the order of 2000 Å. The second polysilicon layer may be doped in situ or implant doped after deposition. The second polysilicon layer can be doped to a concentration of $2E20$ atoms/cm$^3$ of arsenic (As), or any other suitable dopant.

Figure 6:
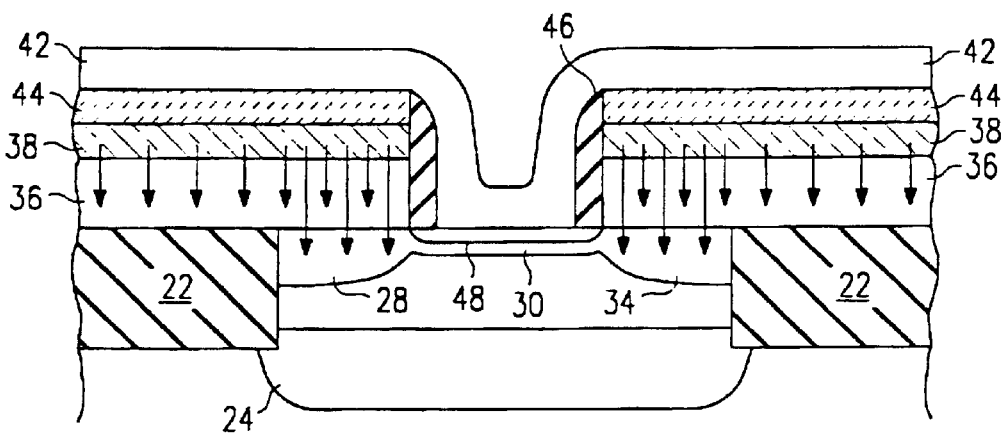
FIG. 6 is a representative section view of the diffusion of dopants from the IPD into the base electrode and base regions in a bipolar process.
Figure 7:
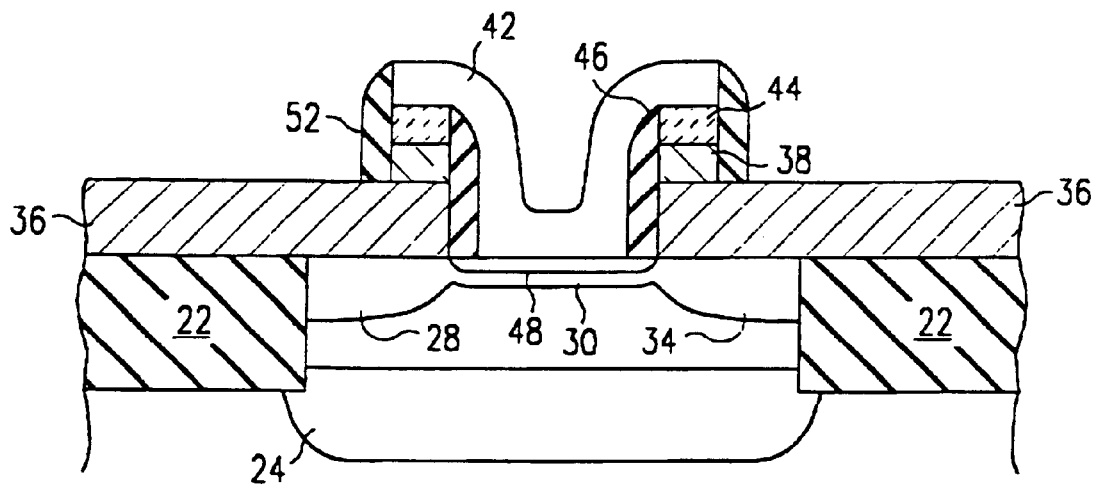
FIG. 7 is a representative section view of the emitter contact structure of a BJT in a bipolar process.

From the structure shown in FIG. 5, the processing steps for forming a BJT 20 in a solely bipolar process are shown in FIGS. 6 and 7. In a bipolar process, the IPD 38 can be used as the sole dopant source for the extrinsic and link-up base regions 32 and 34 and the base electrode 36. The dopant will diffuse from the IPD into the base electrode 36, and then into the underlying silicon to form both the extrinsic 32 and link-up 34 regions. In a bipolar process, the base electrode 36 does not need to be exposed for the patterning and doping of the steps necessary to form the CMOS gates, so the IPD 38 can be left covering the base electrode 36 until after the emitter RTA step. This assures that the entire base electrode 36 is heavily and evenly doped. The IPD 38 can then be removed from the base electrode 36 to allow contact and silicidation.

FIG. 6 shows the next step after FIG. 5 for a bipolar process. After the emitter polysilicon 42 is deposited, an emitter RTA (rapid thermal anneal) is performed. The emitter RTA diffuses the dopant from the IPD 38 into the collector region 26 to form the link-up base region 34 and extrinsic base region 32. In addition, the dopant evenly diffuses from the IPD 38 into the base electrode 36, which is required to reduce the resistivity of the base electrode 36. The capping layer 44 inhibits the up-diffusion of the dopant from the IPD 38 to the emitter electrode 42. An acceptable emitter RTA is performed in an $N_2$ atmosphere at 1030 C. for 10 seconds.

The next step, as shown in FIG. 7, is to pattern the emitter electrode 42 and etch the emitter electrode 42, capping layer 44 and IPD 38 down to the top surface of the base electrode 36 in one process step. This requires only one patterning step. The etch process is preferably anisotropic and selective to polysilicon so as to not damage the base electrode 36. The IPD 38 and capping layer 44 are thus self-aligned to the profile of the emitter polysilicon 42. Outer sidewall spacers 52 of $Si_3N_4$ or TEOS, or other suitable material, are then formed on the common outer sidewalls 54 of the emitter polysilicon 42, capping layer 44 and IPD 38. Normal bipolar processing from this point on can be used to fabricate a functional semiconductor device. This is an improvement over the existing bipolar BJT processes since the extrinsic 32 and link-up 34 base regions are formed in the same step as the base electrode is doped. This saves processing steps and is more efficient.

Continuing from FIG. 5, in forming a BJT in a BiCMOS environment, other considerations need to be taken into account. In a BiCMOS process in which the base polysilicon electrodes in the BJTs and the gate polysilicon electrodes (not shown) are formed using a common polysilicon deposition, the emitter RTA step should be performed after the IPD 38 has been removed from the pate areas in the CMOS regions. One way of performing this without additional lithography and patterning steps is to remove the IPD 38 immediately after the emitter polysilicon etch, which automatically self-aligns the IPD 38 coextensively with the emitter polysilicon pattern. In this application of the IPD diffusion source, it must be assured that the dopant level in the IPD 38 is sufficient to 1) form both the extrinsic 32 and link-up 34 base regions, and 2) provide a low resistance base electrode 36 after metal contacts for connecting polysilicon to the rest of the circuit are made.

Figure 8:
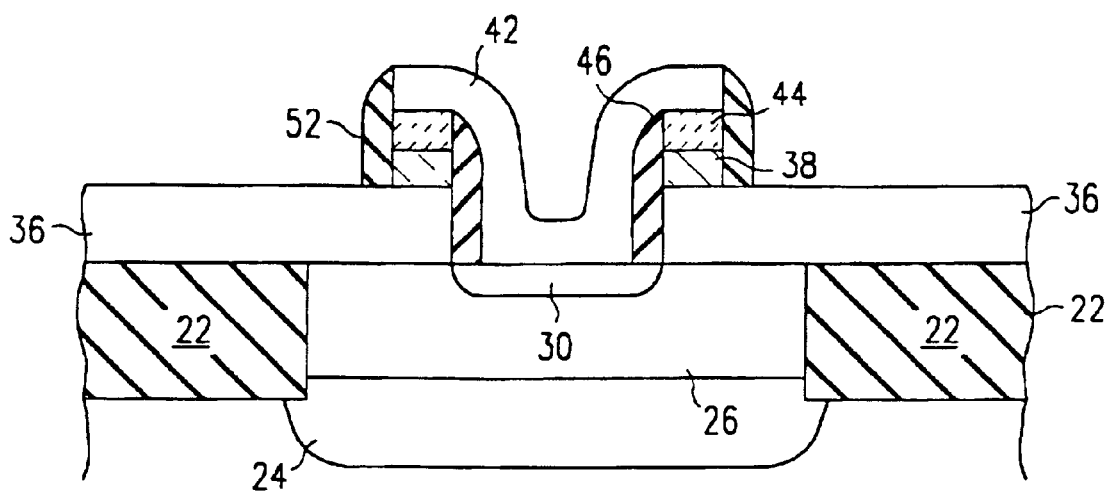
FIG. 8 is a representative section view of the emitter contact structure of a BJT in a BiCMOS process.

Thus, as shown in FIG. 8, the emitter polysilicon 42 is then patterned and etched to remove the emitter polysilicon, capping layer 44 and IPD 38 diffusion source layer, and stop on the top surface of the first layer of polysilicon 36. This is done with only one lithography step. The etch is preferably anisotropic, and stops on the top surface of the base electrode 36 without damaging it. The etch process can have different steps to allow efficient etching through the different layers. The anisotropic etch also self-aligns the capping layer 44 and IPD 38 to the emitter polysilicon 42. The emitter polysilicon 42, capping layer 44, and IPD 38 are thus removed from the majority of the base electrode 36, except that they remain positioned above and overlap the inner end 40 of the base electrode 36 over the base link-up region 34, and part of the extrinsic base region 32. The IPD 38, capping layer 44 and emitter polysilicon 42 form an emitter contact stack, and are all coextensive to one another and form a common outer sidewall 54. The emitter polysilicon 42, capping layer 44 and IPD 38 extend laterally and overlap, as indicated by dimension "A", the inner end 40 of the base electrode 36 approximately 0.15 to 0.3 microns, for the reasons set forth below.

Outer sidewall spacers 52 are then formed on the outer sidewall 54 of the stack. They are formed to improve the topographical transition for subsequent layers, and to isolate the silicide formation on the exposed emitter 42 and base 36 electrode surfaces if silicide is used. The outer sidewall spacers 52 are formed by known or available deposition and anisotropic etchback process. The outer sidewall spacers can be $Si_3N_4$ or other suitable dielectric material.

A rapid thermal anneal (RTA) is then performed which diffuses the dopant from the emitter polysilicon 42 to form the emitter region 48 in the top layer of the epitaxial silicon, as shown in FIG. 8(a). The RTA is performed at 1030° C. for 10 seconds. The extrinsic base region 32 and the base link-up region 34 are simultaneously formed during this RTA from the dopant originating in the IPD diffusion source layer 38. The inner end 40 of the base electrode 36 is also doped from the IPD 38, as the lateral diffusion of the dopant through the base electrode 36 to the extrinsic 32 and link-up 34 base regions occurs. The doped region 62 of the inner end 40 of the base electrode 36 extends outwardly at least under the outer side wall spacers 52, and improves the resistivity characteristics of the base electrode 36 in this diffusion region 62. Depending on the desired particular design process and parameters, the outer sidewall spacers 52 can be formed after the RTA in some processes.

The process step described above is shown in FIG. 9(a). It is the first approach in addressing the concerns mentioned above. This process requires that a sufficient overlap "A" of the emitter polysilicon 42 pattern over the inner end 40 of the base electrode 36 exists. Because the diffusion of dopant species in polysilicon is typically 10 to 30 times faster than in silicon, the IPD 38 can provide sufficient dopant to form the link-up 34 and extrinsic 32 base regions through the base electrode 36, provided that the IPD 38 over the base polysilicon 36 has a sufficient volume and dopant concentration to supply the necessary amounts of dopants to saturate the base electrode 36. An adequate volume of IPD 38 overlapping the base polysilicon 36 can be assured by overlapping the combination of emitter polysilicon 42 and IPD pattern as a stack so that approximately half of the area of the polysilicon 42 in contact with the underlying single crystal silicon surface is covered with IPD 38. This should result in a sufficient supply of dopants in the base polysilicon 36 after diffusion from the IPD 38. A suitable volume of IPD 38 is believed to be available for the dopant requirements set forth where the IPD 38 is at least 500 Å thick, the IPD 38 is doped to approximately 5% by weight (such as with Boron), and the overlap "A" measures approximately 0.3 microns.

Figure 9A:
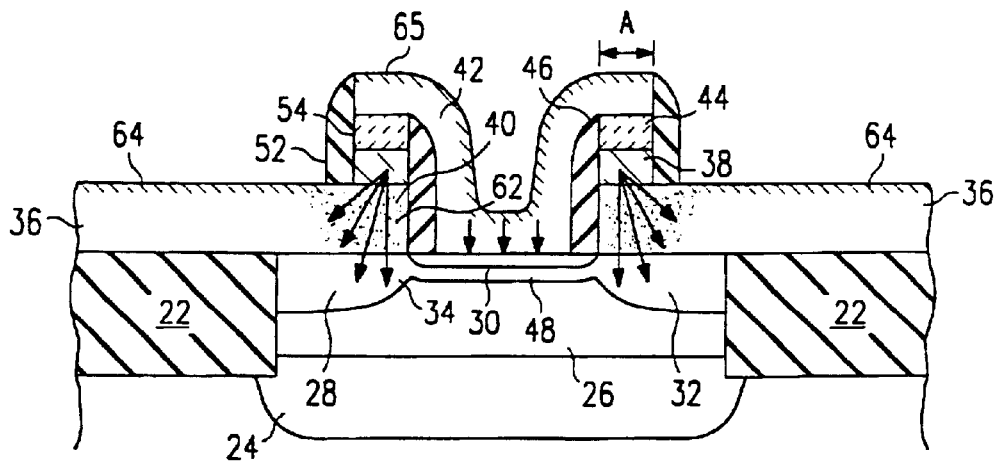
FIGS. 9(a) and (b) are representative sections of diffusion steps in the formation of a BJT in a BiCMOS process.

Even still, without an additional implant step, the largest amount of gate polysilicon (and base polysilicon), found on the field isolation regions, will remain undoped. However, in this processing method, the base polysilicon 36 will be reacted with Ti to form a silicide layer 64 having a low resistance characteristic. A layer 65 of silicide will also form on the emitter electrode. The silicidation can be performed in any known or available manner. The lateral diffusion of the dopant through the inner end 40 of the base electrode 36 and under the emitter polysilicon outer sidewall spacer 52, which occurs during the emitter RTA, provides the lateral conduction path to link the heavily doped inner end 40 of the base electrode 36 to the low resistance silicide layer 64 covering the undoped portion of the base polysilicon 36, as shown in FIG. 9(a).

Figure 9B:
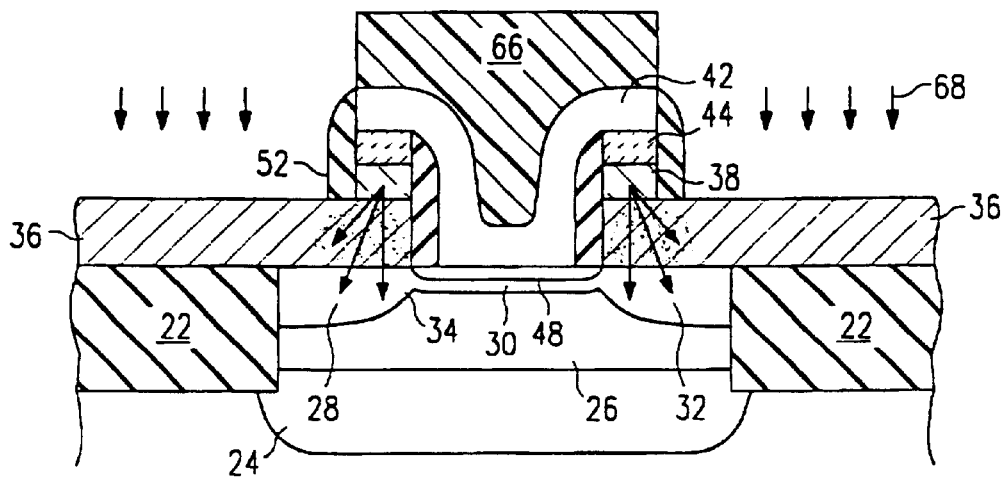
Figure 10:
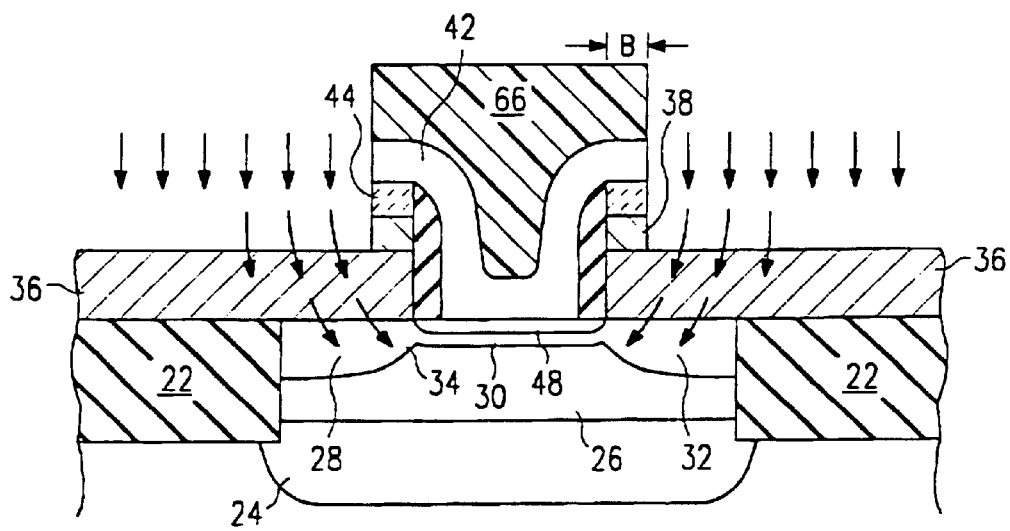
FIG. 10 is a representative section view of alternative diffusion steps in the formation of a BJT in a BiCMOS process.

Alternatively with respect to addressing the two concerns set forth above, a known or available P+ source/drain implant step can provide a dopant to improve (reduce) the resistivity characteristics of the base electrode 36. This treatment of the base electrode occurs after the emitter RTA anneal and the formation of the extrinsic base 32 and link-up 34 base regions. This procedure is shown in FIG. 9(b). First, the P+ source/drain implant lithography 66 is patterned to overlap the edge of emitter polysilicon 42. Because the portion of the emitter polysilicon 42 that is overlapped by the P+ source/drain implant photoresist pattern 66 is not directly intact with the emitter single crystal silicon diffusion, and because the presence of heavy n-type dopants will prevent the lateral diffusion of subsequently added p-type dopant, the implant does not alter the emitter formation. Basically, the B will not diffuse into the single crystal silicon emitter. See FIG. 9(b).

Next, a P+ source/drain implant 68 is performed. Acceptable parameters for the P+ source/drain implant step include using Boron as the dopant, and performing the implant at 20 KeV and $3E15$ $cm^2$ The P+ source/drain implant step, performed after the P+ source/drain implant pattern 66 is applied, forms a second source of dopant for the base polysilicon 36, and can also help form the extrinsic base and/or link-up regions. Thus, the silicidation of the base electrode 36, as described above, is optional. It can be used in addition to the implant to further reduce the base electrode resistance. The overlapping combination of emitter polysilicon 42 and IPD 28 is now useful because the IPD layer 28 surrounding the emitter contact stack is not the source of all of the dopant for the extrinsic base 32 and base link-up 34 regions.

Further, if the lateral overlap of the IPD 38 and emitter polysilicon 42 over the inner end 40 of the base polysilicon 36 is small enough, the IPD diffusion source may be replaced by an undoped oxide, such as TEOS, with no need for the capping layer 44, and the P+ source/drain implant 68 can be used as the sole supply of dopant for the base polysilicon 36 and the base regions (link-up 34 and extrinsic 32). The P+ source/drain implant pattern 68 is applied, as before, to cover the emitter electrode over the emitter windows. The P+ source/drain implant, such as the one mentioned above, dopes the base electrode 36 sufficiently so that the dopants diffuse laterally to form the base link-up 34 and extrinsic base 32 regions. See FIG. 10. An acceptably small overlap "B" of the emitter polysilicon 42, capping layer 44 and the IPD 38 over the inner end 40 of the base electrode 36 is in the range of approximately 0.0 to 0.15 microns.

The above methods disclosed for forming a BJT in a BiCMOS device can be combined as required to appropriately diffuse dopant from the IPD 38 or a P+ source/drain implant 68 step to form the extrinsic base 32 and base link-up 34 regions, and dope the base electrode 36 for resistivity purposes.

The above structure and associated method for using a boro-silicate-glass inter-poly-dielectric (BSG IPD) between the base 36 and emitter 42 polysilicon, allow the fabrication of a BJT 20 in either a bipolar or BiCMOS process flow without needing the costly extrinsic base mask and implant steps.

While this invention has been described with reference to the illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

I claim:

1. A method for constructing a bipolar transistor in a BICMOS process, comprising the acts of:

providing a semiconductor substrate having a collector region;

forming a base electrode layer on the collector region;

forming an inter-polysilicon dielectric layer, having a first dopant therein, on the base electrode layer;

forming a capping layer on the inter-polysilicon dielectric layer;

forming a window through the capping layer, inter-polysilicon dielectric layer, and base electrode layer to open on a top surface of the substrate;

forming the intrinsic base region in the collector region;

forming an emitter electrode layer, having a second dopant, on the capping layer and extending into the window to contact the intrinsic base region;

patterning the emitter electrode with photoresist to selectively cover the emitter electrode over the window;

etching the emitter electrode layer, the capping layer, and the inter-polysilicon layer, where not covered with photoresist, to remove the layers from the base electrode;

diffusing the first dopant from the inter-polysilicon dielectric layer into and through the base electrode, to dope the base electrode with the first dopant, and to form an extrinsic base region and a base link-up region in the collector region; and diffusing the second dopant from the emitter polysilicon layer into the intrinsic base region to form an emitter region therein.

2. A method for constructing a bipolar transistor in a BiCMOS process as defined in claim 1, further comprising the act of forming a silicide layer on the base electrode.

3. A method for constructing a bipolar transistor in a BiCMOS process as defined in claim 2, wherein the silicide is Ti-silicide.

4. A method for constructing a bipolar transistor in a BiCMOS process as defined in claim 1, wherein:

the base electrode defines an inner end overlying the extrinsic base region; and the act of diffusing the first dopant into the base electrode includes diffusing the dopant into the inner end of the base electrode.

5. A method for constructing a bipolar transistor in a BiCMOS process, comprising the acts of:

providing a semiconductor substrate having a collector region;

forming a base electrode layer on the collector region;

forming an inter-polysilicon dielectric layer, having a first dopant therein, on the base electrode layer;

forming a capping layer on the inter-polysilicon dielectric layer;

forming a window through the capping layer, inter-polysilicon dielectric layer, and base electrode layer to open on a top surface of the collector region in the substrate;

forming the intrinsic base region in the collector region;

forming an emitter electrode layer, having a second dopant, on the capping layer and extending into the window to contact the intrinsic base region;

patterning the emitter electrode with photoresist to selectively cover the emitter electrode over the window;

etching the emitter electrode layer, the capping layer, and the inter-polysilicon layer, where not covered with photoresist, to remove the layers from the base electrode;

diffusing the first dopant from the inter-polysilicon dielectric layer into and through the base electrode, to dope the base electrode with the first dopant, and to form an extrinsic base region and a base link-up region in the collector region;

diffusing the second dopant from the emitter polysilicon layer into the intrinsic base region to form an emitter region therein;

patterning the emitter polysilicon with a P+ source/drain implant pattern to cover the emitter electrode over the window with photoresist; and performing a source/drain implant to implant a third dopant into the emitter electrode not covered with photoresist.

6. A method for constructing a bipolar transistor in a BiCMOS process as defined in claim 5, wherein:

the base electrode defines an inner end overlying the extrinsic base region; and the act of diffusing the first dopant into the base electrode includes diffusing the dopant into the inner end of the base electrode.

7. A method for constructing a bipolar transistor in a BiCMOS process as defined in claim 5, further including the act of forming a silicide layer on the base electrode.

8. A method for constructing a bipolar transistor in a BICMOS process, comprising the acts of:

providing a semiconductor substrate having a collector region;

forming a base electrode layer on the collector region;

forming an inter-polysilicon dielectric layer on the base electrode;

forming a capping layer on the inter-polysilicon dielectric layer;

forming an emitter window through the capping layer, inter-polysilicon dielectric layer, and base electrode layer, the window opening to a top surface of the substrate including the collector region;

forming the intrinsic base region in the collector region;

forming an emitter electrode layer, having a first dopant, on the capping layer and extending into the window to contact the intrinsic base region;

patterning the emitter electrode with photoresist to selectively cover the emitter electrode over the window;

etching the emitter electrode layer, the capping layer, and the inter-polysilicon layer, where not covered with photoresist, to remove the layers from the base electrode;

patterning the emitter polysilicon with a P+ source/drain implant pattern to cover the emitter electrode over the window with photoresist, and performing a source/drain implant to implant a second dopant into the emitter electrode not covered with photoresist, the second dopant also diffusing to the collector region to form an extrinsic base region and a base link-up region.

9. A method for constructing a bipolar transistor in a BiCMOS process, wherein the patterning the emitter electrode allows the emitter electrode to laterally overlap the base electrode after the etching step.

* * * * *